(12) United States Patent
Lee

(10) Patent No.: US 7,652,514 B2
(45) Date of Patent: Jan. 26, 2010

(54) INTERNAL CLOCK DRIVER CIRCUIT

(75) Inventor: Kang Youl Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/966,225

(22) Filed: Dec. 28, 2007

(65) Prior Publication Data
US 2008/0303574 A1 Dec. 11, 2008

(30) Foreign Application Priority Data
Jun. 11, 2007 (KR) .................. 10-2007-0056941

(51) Int. Cl.
*H03H 11/26* (2006.01)
(52) U.S. Cl. ........................ 327/263; 327/296
(58) Field of Classification Search .................. None
See application file for complete search history.

(56) References Cited
U.S. PATENT DOCUMENTS

| 6,342,796 | B2 * | 1/2002 | Jung ........................ 327/141 |
| 6,809,600 | B2 | 10/2004 | Chang et al. |
| 6,809,601 | B2 | 10/2004 | Da Dalt |
| 6,825,703 | B1 | 11/2004 | Kwak |
| 6,894,539 | B2 * | 5/2005 | Kim ........................ 327/3 |
| 6,924,686 | B2 * | 8/2005 | Kirsch ..................... 327/277 |
| 7,046,061 | B2 | 5/2006 | Kwak |
| 7,071,751 | B1 * | 7/2006 | Kaviani .................... 327/263 |
| 7,081,784 | B2 * | 7/2006 | Kang ....................... 327/291 |
| 7,385,430 | B2 * | 6/2008 | Lee ........................ 327/291 |
| 7,421,607 | B2 * | 9/2008 | Li et al. ................... 713/401 |
| 2004/0047441 | A1 | 3/2004 | Gauthier et al. |
| 2004/0240298 | A1 * | 12/2004 | Jin ........................ 365/222 |
| 2006/0034395 | A1 | 2/2006 | Evans et al. |

FOREIGN PATENT DOCUMENTS

| JP | 2003101409 | 4/2003 |
| JP | 2005020686 | 1/2005 |
| JP | 2006060842 | 3/2006 |
| KR | 1019990058632 | 7/1999 |
| KR | 10-0262722 | 5/2000 |
| KR | 100475892 | 3/2005 |
| KR | 1020060013204 | 2/2006 |

* cited by examiner

*Primary Examiner*—Cassandra Cox
(74) *Attorney, Agent, or Firm*—Baker & McKenzie LLP

(57) ABSTRACT

An internal clock signal driver circuit includes a delay block that delays a rising clock signal and a falling clock signal, and outputs a delayed rising clock signal and a delayed falling clock signal, a rising DLL clock signal generating block that receives and combines the rising clock signal, the falling clock signal, and the delayed rising clock signal, and outputs a rising DLL clock signal, and a falling DLL clock signal generating block that receives and combines the rising clock signal, the falling clock signal, and the delayed falling clock signal, and outputs a falling DLL clock signal.

23 Claims, 6 Drawing Sheets

INTERNAL CLOCK DRIVER CIRCUIT

CROSS-REFERENCES TO RELATED APPLICATION

The present application claims priority under 35 U.S.C. 119(a) to Korean Patent Application number 10-2007-0056941, filed on Jun. 11, 2007, in the Korean Intellectual Property Office, the contents of which are incorporated herein by reference in their entirety as if set forth in full.

BACKGROUND

1. Technical Field

The embodiments described herein relate to a semiconductor integrated circuit, and in particular, to an internal clock signal driver circuit of the semiconductor integrated circuit.

2. Related Art

A conventional DLL clock signal driver receives a rising clock signal 'RCK' and a falling clock signal 'FCK', and generates a rising DLL clock signal 'RCKDLL' and a falling DLL clock signal 'FCKDLL' each having a predetermined pulse width.

As shown in FIG. 1, a conventional DLL clock signal driver includes a first pulse generating block 10 that generates the rising DLL clock signal 'RCKDLL', and a second pulse generating block 20 that generates the falling DLL clock signal 'FCKDLL'.

The first pulse generating block 10 includes a first delay unit 11, first and second inverters IV1 and IV2, and a NAND gate ND1. The first delay unit 11 receives and delays the rising clock signal 'RCK', and the first inverter IV1 inverts the output signal of the first delay unit 11. The NAND gate ND1 receives the rising clock signal 'RCK' and the output signal of the first inverter IV1, and performs a NAND operation. The second inverter IV2 inverts the output signal of the NAND gate ND1.

Similarly to the first pulse generating block 10, the second pulse generating block 20 includes a second delay unit 22, third and fourth inverters IV3 and IV4, and a NAND gate ND2. The second pulse generating block 20 is different from the first pulse generating block 10 in that the falling clock signal 'FCK' is input as an input signal.

Here, as shown in FIG. 2, the rising DLL clock signal 'RCKDLL' and the falling DLL clock signal 'FCKDLL' should not overlap each other. In addition, the rising DLL clock signal 'RCKDLL' and the falling DLL clock signal 'FCKDLL' have a pulse width smaller than the rising clock signal 'RCK' and the falling clock signal 'FCK'.

Generally, the DLL clock signal is basically driven on the conditions that the rising DLL clock signal 'RCKDLL' at the rising edge and the falling DLL clock signal 'FCKDLL' at the falling edge should not overlap each other, and the rising edges of the DLL clock signals 'RCKDLL' and 'FCKDLL' should be maintained. If any one of the two conditions is not satisfied, then the data 'DQ' and the data strobe signal 'DQS' of the semiconductor integrated circuit, which are output according to the rising DLL clock signal 'RCKDLL' and the falling DLL clock signal 'FCKDLL', can be distorted. If this occurs, then the semiconductor integrated circuit can not operate normally at high frequency.

Here, the rising clock signal 'RCK' and the falling clock signal 'FCK' as the input signals can have effective values enough to generate the DLL clocks 'RCKDLL' and 'FCKDLL' at the rising edges thereof. In addition, the pulse widths of the rising clock signal 'RCK' and the falling clock signal 'FCK' can vary, and even the two clock signals 'RCK' and 'FCK' can overlap each other. For this reason, the rising DLL clock signal 'RCKDLL' and the falling DLL clock signal 'FCKDLL', which are generated based on the rising and falling clocks 'RCK' and 'FCK', can overlap each other. However, a conventional DLL clock signal driver internally generates pulses having a prescribed width and uses the generated pulses. Accordingly, if the operation frequency is low, then the DLL clocks 'RCKDLL' and 'FCKDLL' do not overlap each other, and also the rising edges of the DLL clocks 'RCKDLL' and 'FCKDLL' are well maintained.

Meanwhile, in a conventional DLL clock signal driver, the pulse widths of the rising clock signal 'RCK' and the falling clock signal 'FCK' as the input signals are adjusted by the delay units 11 and 22 therein. Accordingly, the pulse widths of the rising clock signal 'RCK' and the falling clock signal 'FCK' can be the same or can be smaller than a prescribed width. At this moment, the output signals can be distorted and can overlap each other.

To solve these problems, as shown in FIG. 3, a conventional DLL clock signal driver having a latch block has been proposed.

A DLL clock signal driver circuit shown in FIG. 3 includes a first pulse generating block 30, a second pulse generating block 40, a first latch block 50, and a second latch block 60.

The first and second pulse generating blocks 30 and 40 have the same configuration as the first and second pulse generating blocks 10 and 20 shown in FIG. 1. The first latch block 50 includes third and fourth NAND gates ND3 and ND4, and a fifth inverter IV5, while the second latch block 60 includes fifth and sixth NAND gates ND5 and ND6, and a sixth inverter IV6.

The DLL clock signal driver shown in FIG. 3 is used for a semiconductor integrated circuit driving a high frequency band, and the outputs of the first and second pulse generating blocks 30 and 40 are input to the first and second latch blocks 50 and 60.

FIG. 4 is a timing chart of the DLL clock signal driver circuit shown in FIG. 3.

The output 'RCKPB' of the first pulse generating block 30 is disabled when the rising clock signal 'RCK' is enabled, and is enabled when the delayed rising clock signal 'RCKDB' is disabled. In addition, the output 'FCKPB' of the second pulse generating block 40 is disabled when the falling clock signal 'FCK' is enabled, and is enabled when the delayed falling clock signal 'FCKDB' is disabled.

The rising DLL clock signal 'RCKDLL' is enabled when the output 'RCKPB' of the first pulse generating block 30 is disabled, and is disabled when the output 'FCKPB' of the second pulse generating block 40 is disabled.

The falling DLL clock signal 'FCKDLL' is enabled when the output 'FCKPB' of the second pulse generating block 40 is disabled, and is disabled when the output 'RCKPB' of the first pulse generating block 30 is disabled.

However, the DLL clock signal driver shown in FIG. 3 also internally generates the pulses during a predetermined period, although the limited region, by the given pulse generating blocks 30 and 40. That is, the DLL clock signal drivers shown in FIGS. 1 and 3 internally generate the pulses based on the input signals 'RCK' and 'FCK' to prevent the DLL clocks 'RCKDLL' and 'FCKDLL' from overlapping each other and to maintain the rising edges. In this way, if the pulses are internally generated, then the operation can be secured within a frequency range until the widths of the input signals 'RCK' and 'FCK' and the widths of the internal pulses are the same. When the widths of the input signals 'RCK' and 'FCK' are smaller than the widths of the internal pulses, the output data can be distorted.

A conventional DLL clock signal driver has frequency limitations, and when the transistors have low performance, the rising and falling slopes of the internal pulses are increased. Then, the complete pulses can not be generated and in the worst case, the pulses can be lost, which can result in an erroneous operation.

In addition, since the wires through which the rising DLL clock signal 'RCKDLL' and the falling DLL clock signal 'FCKDLL' are transmitted are arranged over the entire semiconductor integrated circuit, they are affected by parasitic capacitance. Furthermore, when the characteristics of the transistors are changed due to the process parameters, the rising time and the falling time of the rising DLL clock signal 'RCKDLL' and the falling DLL clock signal 'FCKDLL' are extended (the level change speed of the signals become slower). In this case, the pulse widths of the rising DLL clock signal 'RCKDLL' and the falling DLL clock signal 'FCKDLL' can not be present.

SUMMARY

An internal clock signal driver circuit that allows a rising DLL clock signal and a falling DLL clock signal not to overlap each other, regardless of an operation frequency is described herein.

According to one aspect, an internal clock signal driver circuit includes a delay block that delays a rising clock signal and a falling clock signal, and outputs a delayed rising clock signal and a delayed falling clock signal, a rising DLL clock signal generating block that receives and combines the rising clock signal, the falling clock signal, and the delayed rising clock signal, and outputs a rising DLL clock signal, and a falling DLL clock signal generating block that receives and combines the rising clock signal, the falling clock signal, and the delayed falling clock signal, and outputs a falling DLL clock signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
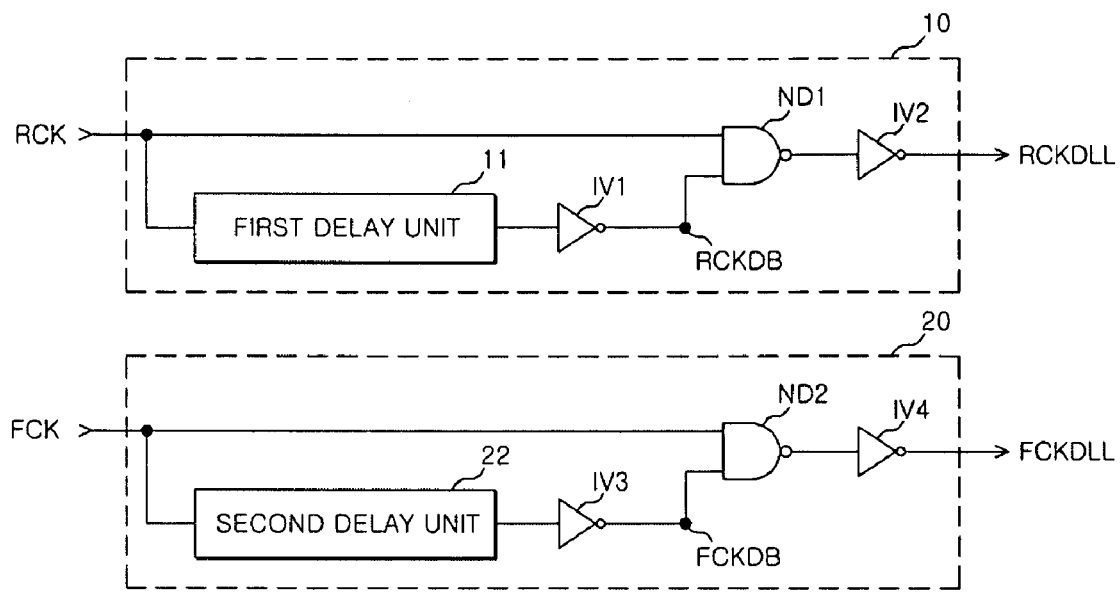
FIG. 1 is a circuit diagram showing an exemplary DLL clock signal driver circuit.
Figure 2:
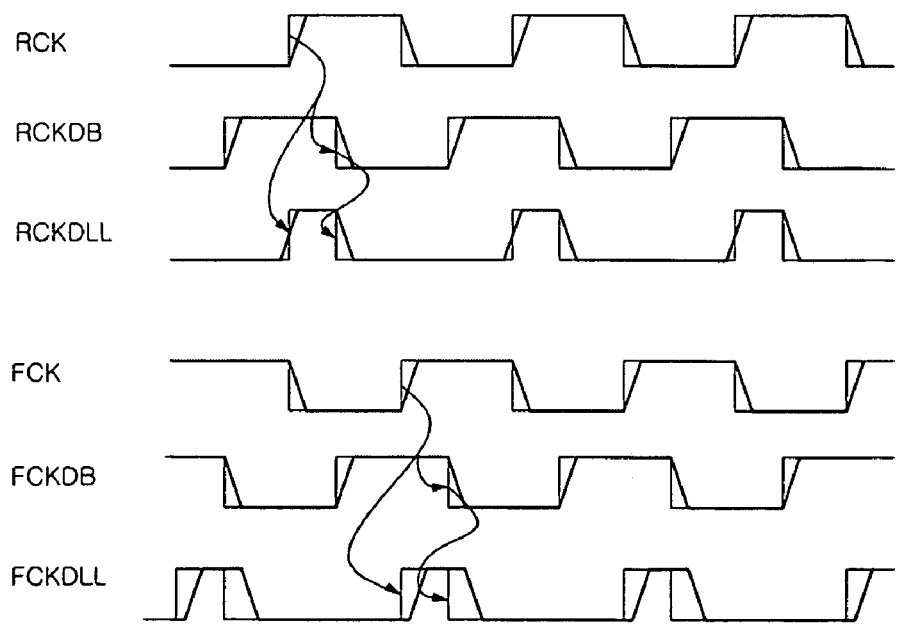
FIG. 2 is a timing chart illustrating the operation of the DLL clock signal driver circuit shown in FIG. 1.
Figure 3:
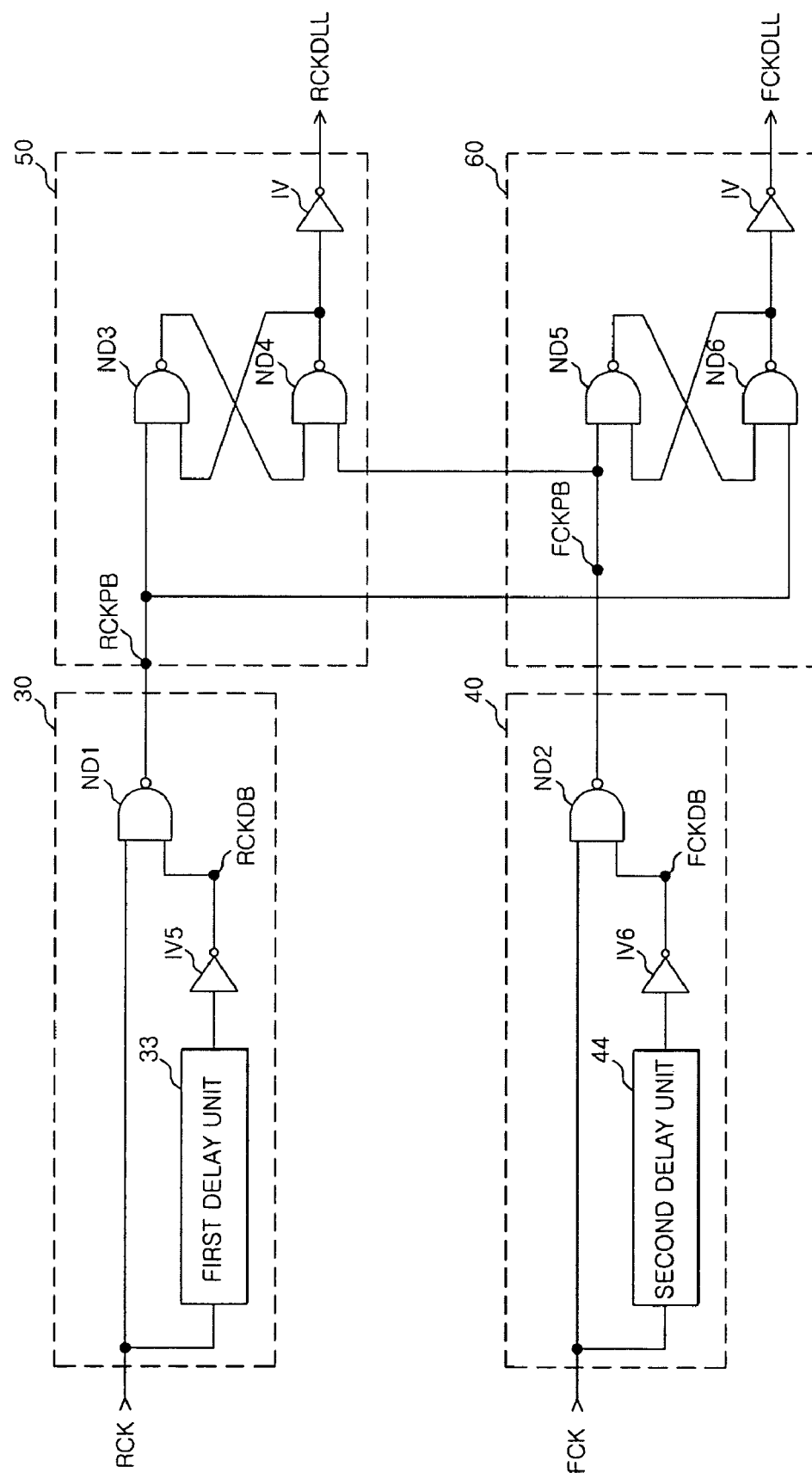
FIG. 3 is a circuit diagram of another exemplary DLL clock signal driver circuit.
Figure 4:
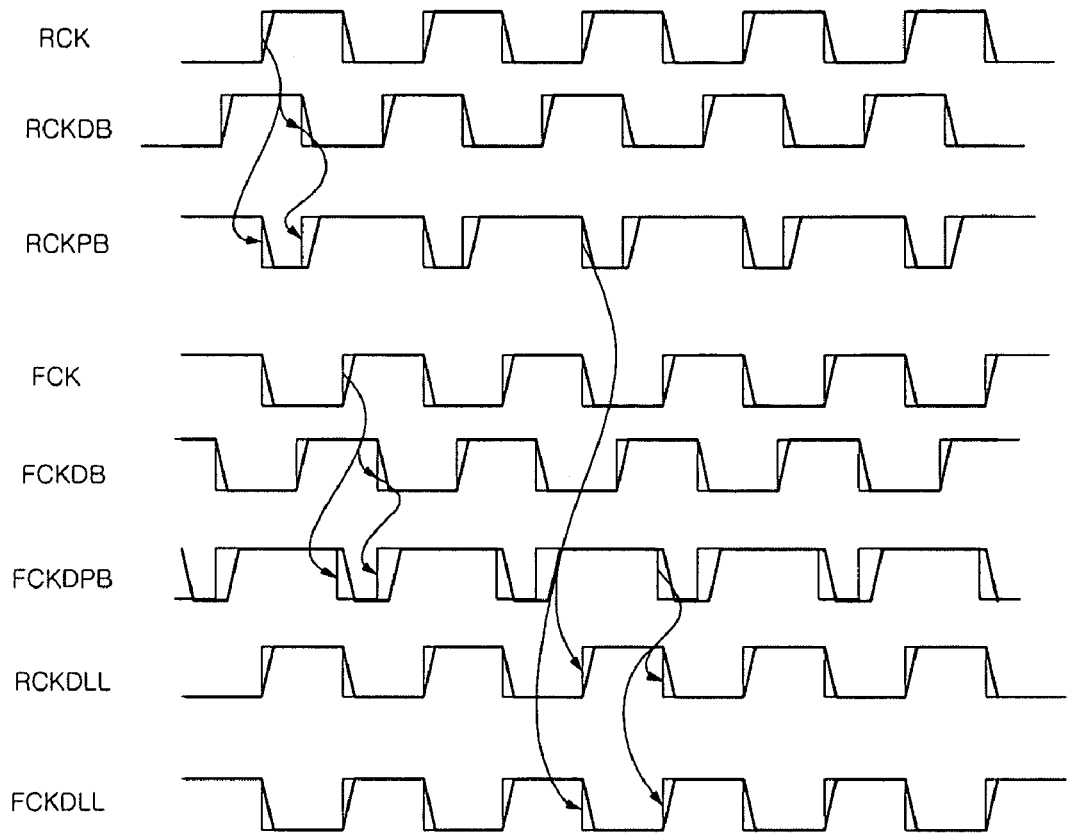
FIG. 4 is a timing chart illustrating the operation of the DLL clock signal driver circuit shown in FIG. 3.
Figure 5:
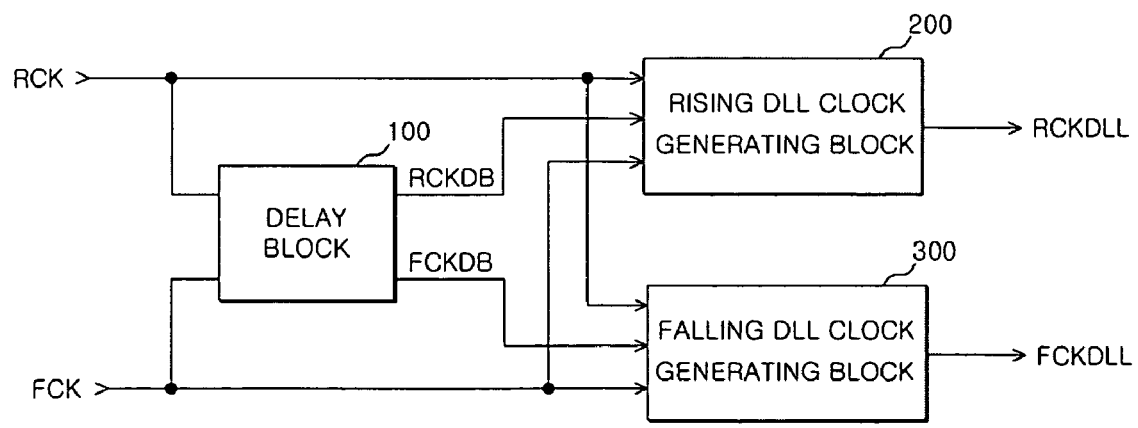
FIG. 5 is a block diagram of a DLL clock signal driver circuit according to one embodiment.
Figure 6:
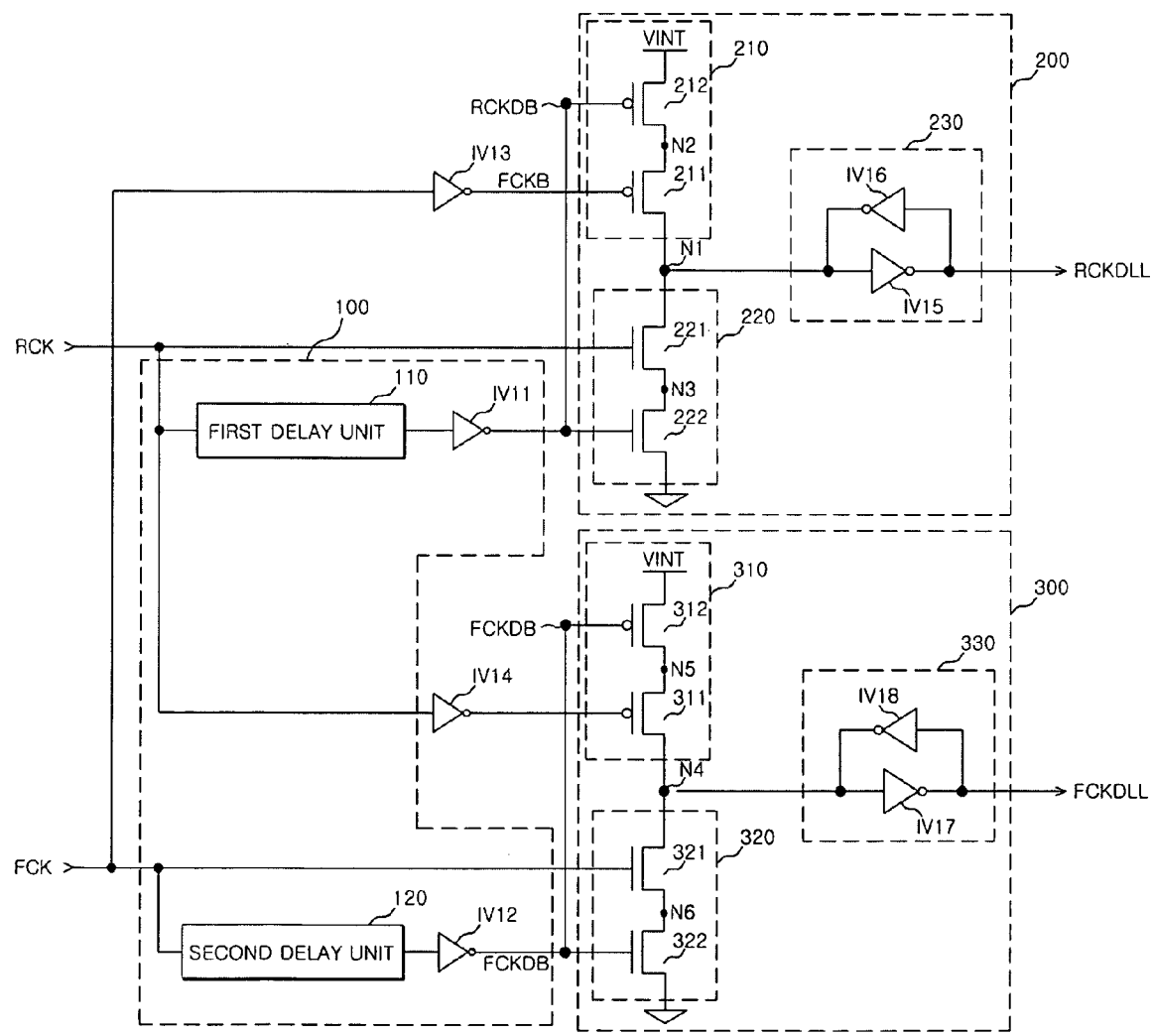
FIG. 6 is a detailed circuit diagram of the DLL clock signal driver circuit shown in FIG. 5.

Referring to FIGS. 5 and 6, it can be seen that a DLL clock signal driver circuit configured in accordance with one embodiment can include a delay block 100, a rising DLL clock signal generating block 200, and a falling DLL clock signal generating block 300.

The delay block 100 can be configured to delay a rising clock signal 'RCK' and a falling clock signal 'FCK' to generate a delayed rising clock signal 'RCKDB' and a delayed falling clock signal 'FCKDB'. The delay block 100 can be implemented by a delay circuit that delays the rising clock signal 'RCK' and the falling clock signal 'FCK' for a predetermined time.

At this time, the rising clock signal 'RCK' and the falling clock signal 'FCK' can have the same cycle and different phases. For example, the rising clock signal 'RCK' and the falling clock signal 'FCK' can be complementary signals that are obtained by splitting the phases of the DLL clock signals generated by the DLL circuit. Alternatively, the rising clock signal 'RCK' and the falling clock signal 'FCK' can be signals that are obtained by changing the phases of two signals to be transmitted through the signal lines in the semiconductor integrated circuit. In this case, the high-level periods of the rising clock signal and the falling clock signal can overlap each other.

As shown in FIG. 6, the delay block 100 can include a first delay unit 110, a first inverter 11, a second delay unit 120 and a second inverter 12. The first delay unit 110 and the second inverter 11 can be configured to delay and invert the rising clock signal 'RCK' and generate the delayed rising clock signal 'RCKDB'. The second delay unit 120 and the second inverter 12 can be configured to delay and invert the falling clock signal 'FCK' and output the delayed falling clock signal 'FCKDW'. At this time, the first delay unit 110 can be configured to delay the rising clock signal 'RCK' for a first time, and the second delay unit 120 can be configured to delay the falling clock signal 'FCK' for a second time. The first time and the second time can be identical or different.

The rising DLL clock signal generating block 200 can be configured to receive the rising clock signal 'RCK', the falling clock signal 'FCK', and the delayed rising clock signal 'RCKDB', and generate a rising DLL clock signal 'RCKDLL'.

As shown in FIG. 6, the rising DLL clock signal generating block 200 can include a first pull-up unit 210, a first pull-down unit 220, and a first latch unit 230.

The first pull-up unit 210 can be configured to pull up a voltage on the first node N1 according to an inverted signal 'FCKB' of the falling clock signal 'FCK' and the delayed rising clock signal 'RCKDB'. For example, the first pull-up unit 210 can be configured to pull up the voltage on the first node N1 when the inverted signal 'FCKB' of the falling clock signal 'FCK' and the delayed rising clock signal 'RCKDB' are simultaneously to disabled.

The first node N1 is a connection node between the first pull-down unit 220 and the first pull-up unit 210. In addition, the inverted signal 'FCKB' of the falling clock signal 'FCK' is generated by a third inverter IV13.

Still referring to FIG. 6, the first pull-up unit 210 can include a first switching element 211 and a second switching element 212. The first switching element 211 can be connected between the first node N1 and a second node N2 and configured to pull up the voltage on the first node N1 to a voltage on the second node N2 according to the inverted signal 'FCKB' of the falling clock signal 'FCK'. In addition, the second switching element 212 is connected between the second node N2 and a power supply voltage terminal VINT to pull up the voltage on the second node N2 to the power supply voltage VINT according to the delayed rising clock signal 'RCKDB'.

For example, the first switching element 211 and second switching element 212 can be PMOS transistors that are connected in series and turned on according to the delayed rising clock signal 'RCKDB' and the inverted signal 'FCKB' of the falling clock signal 'FCK', respectively. It will be understood that in other embodiments, NMOS transistors can be used instead of PMOS transistors.

The first pull-down unit 220 can be configured to pull down the voltage on the first node N1 according to the rising clock signal 'RCK' and the delayed rising clock signal 'RCKDB'. For example, the first pull-down unit 220 can be configured to pull down the voltage on the first node N1 when the rising clock signal 'RCK' and the delayed rising clock signal 'RCKDB' are both enabled. If any one of the rising clock signal 'RCK' and the delayed rising clock signal 'RCKDB' is disabled, then the first pull-down unit 220 is not driven.

Still referring to FIG. 6, the first pull-down unit 220 can include a third switching element 221 and a fourth switching element 222. The third switching element 221 is connected between the first node N1 and a third node N3 to pull down the voltage on the first node N1 to a voltage on the third node N3 according to the rising clock signal 'RCK'. The fourth switching element 222 is connected between the third node N3 and a ground voltage VSS to pull down the voltage on the third node N3 to the ground voltage VSS according to the delayed rising clock signal 'RCKDB'.

Accordingly, the third switching element 221 and the fourth switching element 222 constituting the first pull-down unit 220 can be NMOS transistors that are connected in series and turned on according to the rising clock signal 'RCK' and the delayed rising clock signal 'RCKDB', respectively. Again, it will be understood that in other embodiments, PMOS transistors can be used instead of NMOS transistors.

The first latch unit 230 can be configured to latch the voltage on the first node N1 and output the rising DLL clock signal 'RCKDLL'. When the voltage on the first node N1 is at a high level, the first latch unit 230 can be configured to maintain a high level. Meanwhile, when the voltage on the first node N1 is at a low level, the first latch unit 230 can be configured to maintain a low level.

The first latch unit 230 can include a fifth inverter IV15 and a sixth inverter IV16. The fifth inverter IV15 can be configured to invert the voltage on the first node N1 and output the inverted signal as the rising DLL clock signal 'RCKDLL'. In addition, the sixth inverter IV16 can be configured to receive the output of the fifth inverter IV15 and can have an output terminal connected to the first node N1.

The falling DLL clock signal generating block 300 can be configured to receive the rising clock signal 'RCK', the falling clock signal 'FCK', and the delayed falling clock signal 'FCKDB', and output a falling DLL clock signal 'FCKDLL'.

The falling DLL clock signal generating block 300 can be controlled by the delayed falling clock signal 'FCKDB'. The falling DLL clock signal generating block 300 can include, for example, a second pull-up unit 310, a second pull-down unit 320, and a second latch unit 330.

The second pull-up unit 310 can be configured to pull up a voltage on a fourth node N4 according to an inverted rising clock signal 'RCKB' and the delayed falling clock signal 'FCKDB'. The second pull-up unit 310 can be configured to pull up the voltage on the fourth node N4 when the inverted rising clock signal 'RCKB' and the delayed falling clock signal 'FCKDB' are both disabled. Here, the inverted rising clock signal 'RCKB' can be generated by a fourth inverter IV14.

The fourth node N4 is a connection node between the second pull-down unit 320 and the second pull-up unit 310. The second pull-up unit 310 can include a fifth switching element 311 and a sixth switching element 312. The fifth switching element 311 is connected between the fourth node N4 and a fifth node N5 to pull up the voltage on the fourth node N4 to the fifth node N5 according to the inverted rising clock signal 'RCKB'. In addition, the sixth switching element 312 is connected between the fifth node N5 and the power supply voltage terminal VINT to pull up a voltage on the fifth node N5 to the power supply voltage VINT according to the delayed rising clock signal 'RCKDB'.

For example, the fifth switching element 311 and the sixth switching element 312 can be PMOS transistors that are connected in series and turned on according to the delayed rising clock signal 'RCKDB' and the inverted signal 'FCKB' of the falling clock signal 'FCK', respectively. It will be understood that in other embodiments, NMOS transistors can be used instead of PMOS transistors.

The second pull-down unit 320 can include a seventh switching element 321 and an eighth switching element 322. The seventh switching element 321 is connected between the fourth node N4 and a sixth node N6 to pull down the voltage on the fourth node N4 to a voltage on the sixth node N6 according to the falling clock signal 'FCK'. The eighth switching element 322 is connected between the sixth node N6 and the ground voltage terminal VSS to pull down the voltage on the sixth node N6 to the ground voltage VSS according to the delayed falling clock signal 'FCKDB'.

The seventh and eighth switching elements 321 and 322 can be the NMOS transistors that are connected in series and turned on according to the falling clock signal 'FCK' and the delayed falling clock signal 'FCKDB', respectively. Again, it will be understood that in other embodiments, PMOS transistors can be used instead of NMOS transistors.

The second latch unit 330 can be configured to latch the voltage on the fourth node N4. The second latch unit 330 can include seventh and eighth inverters IV17 and IV18.

That is, the rising DLL clock signal generating block 200 according to this embodiment can be configured to output the rising DLL clock signal 'RCKDLL' that is enabled when the rising clock signal 'RCK' and the delayed rising clock signal 'RCKDB' are both enabled, and is disabled when the inverted signal 'FCKB' of the falling clock signal 'FCK' and the delayed rising clock signal 'RCKDB' are both disabled. Specifically, when any one of the rising clock signal 'RCK' and the delayed rising clock signal 'RCKDB' is disabled, the rising DLL clock signal 'RCKDLL' is not enabled. In addition, when any one of the inverted signal 'FCKB' of the falling clock signal 'FCK' and the delayed rising clock signal 'RCKDB' is enabled, the rising DLL clock signal 'RCKDLL' is not disabled.

As described, the rising DLL clock signal generating block 200 can be implemented with logic gates and transistors to receive the rising clock signal 'RCK', the falling clock signal 'FCK', and the delayed rising clock signal 'RCKDB', and to output the rising DLL clock signal 'RCKDLL'.

The falling DLL clock signal generating block 300 according to this embodiment can be configured to output the falling DLL clock signal 'FCKDLL' that is enabled when the falling clock signal 'FCK' and the delayed falling clock signal 'FCKDB' are both enabled, and is disabled when the inverted signal 'RCKB' of the rising clock signal 'RCK' and the delayed falling clock signal 'FCKDB' are both disabled. That is, when any one of the falling clock signal 'FCK' and the delayed falling clock signal 'FCKDB' is disabled, the falling DLL clock signal 'FCKDLL' is not enabled. In addition, when any one of the inverted signal 'RCKB' of the rising clock signal 'RCK' and the delayed falling clock signal 'FCKDB' is enabled, the falling DLL clock signal 'FCKDLL' is not disabled.

The DLL clock signal driver of this embodiment does not adjust the widths of the internal pulses to overcome the limitation of the operation frequency according to the internal pulses. Therefore, the DLL clocks 'RCKDLL' and 'FCKDLL' can be prevented from overlapping each other, and the rising edges thereof can be maintained.

The operation of the DLL clock signal driver circuit according to the above described embodiment will now be described in detail.

When the rising clock signal 'RCK' and the delayed rising clock signal 'RCKDB' are both at a high level, the first pull-down unit 220 is driven to pull down the voltage on the first node N1 to a low level. Subsequently, the first latch unit 230 maintains the voltage on the first node N1 at a low level even though the first pull-up unit 210 and the first pull-down unit 220 are not driven. Accordingly, the first latch unit 230 inverts the voltage on the first node N1 and outputs the rising DLL clock signal 'RCKDLL' at a high level.

Subsequently, when the inverted signal 'FCKB' of the falling clock signal 'FCK' and the delayed rising clock signal 'RCKDB' are both at a low level, the first pull-up unit 210 is driven to pull up the voltage on the first node N1 to a high level. Accordingly, the first latch unit 230 changes the voltage on the first node N1 from a low level to a high level. In addition, the first latch unit 230 maintains the voltage on the first node N1 at a high level even though the first pull-up unit 210 and the first pull-down unit 220 are not driven. Therefore, the first latch unit 230 outputs the rising DLL clock signal 'RCKDLL' at a low level. In this way, the rising DLL clock signal 'RCKDLL' is set at a high level and reset at a low level depending on the timing of the rising clock signal 'RCK', the delayed rising clock signal 'RCKDB', and the falling clock signal 'FCK'.

The falling DLL clock signal 'FCKDLL' is generated in the same manner as the rising DLL clock signal 'RCKDLL'.

When the falling clock signal 'FCK' and the delayed falling clock signal 'FCKDB' are both at a high level, the second pull-down unit 320 is driven to pull down the voltage on the fourth node N4 to a low level. If the second pull-down unit 320 is driven, and the voltage on the fourth node N4 is changed to a low level, then the second latch unit 330 maintains the voltage on the fourth node N4 at a low level even though the second pull-up unit 310 and the second pull-down unit 320 are not driven. Accordingly, the second latch unit 330 inverts the voltage on the fourth node N4 and outputs the falling DLL clock signal 'FCKDLL' at a high level.

Subsequently, when the inverted signal of the rising clock signal 'RCK' and the delayed falling clock signal 'FCKDB' are both at a low level, the second pull-up unit 310 is driven to pull up the voltage on the fourth node N4 to a high level. Accordingly, the second latch unit 330 changes the voltage on the fourth node N4 from a low level to a high level. In addition, if the second pull-up unit 310 is driven, and the voltage on the fourth node N4 is changed to a high level, then the second latch unit 330 maintains the voltage on the fourth node N4 at a high level even though the second pull-up unit 310 and the second pull-down unit 320 are not driven. Therefore, the second latch unit 330 outputs the falling DLL clock signal 'FCKDLL' at a low level. In this way, the falling DLL clock signal 'FCKDLL' is set at a high level and reset at a low level according to the falling clock signal 'FCK', the delayed falling clock signal 'FCKDB', and the rising clock signal 'RCK'.

According to the embodiments described herein, when the rising DLL clock signal 'RCKDLL' is at a high level, the falling DLL clock signal 'FCKDLL' cannot be at a high level. Therefore, the rising DLL clock signal 'RCKDLL' and the falling DLL clock signal 'FCKDLL' do not overlap each other.

Figure 7:
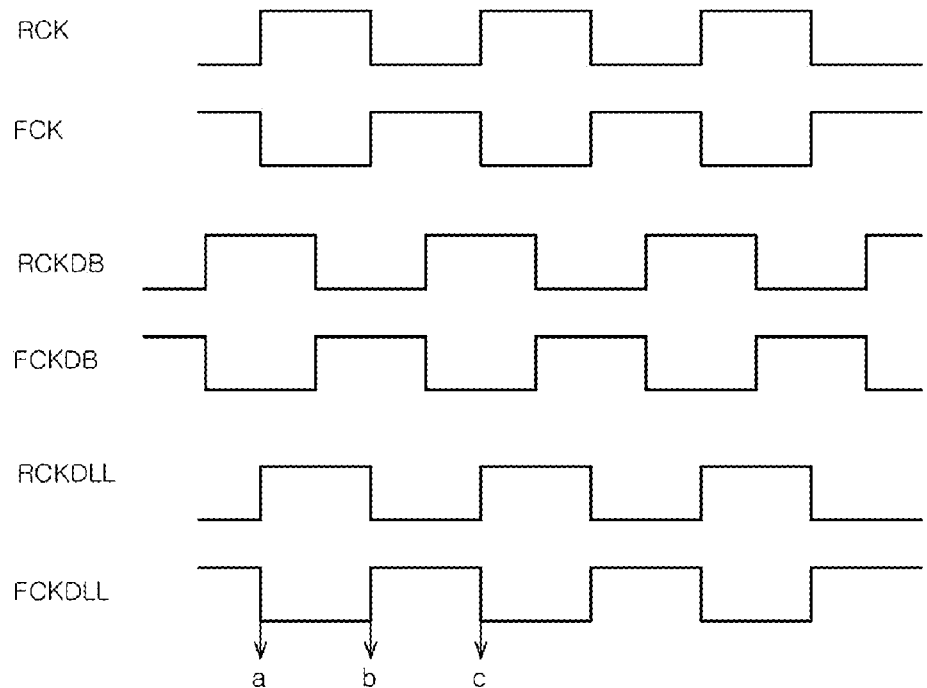
FIGS. 7 to 10 are timing charts illustrating the operation of the DLL clock signal driver circuit shown in FIG. 6.

FIG. 7 is a timing chart of the DLL clock signal driver circuit shown in FIG. 6 when the rising clock signal 'RCK' and the falling clock signal 'FCK' do not overlap each other. In FIG. 7, the delay time provided by the first delay unit 110 and the second delay unit 120 is relatively smaller than the pulse width of the rising clock signal 'RCK'. That is, the rising clock signal 'RCK' has a more delayed phase than the delayed rising clock signal 'RCKDB'.

When the rising clock signal 'RCK' and the delayed rising clock signal 'RCKDB' are both at a high level, the first pull-down unit 220 is driven, and thus the first pull-down unit 220 is not driven until the rising clock signal 'RCK' is changed to a high level. When the rising clock signal 'RCK' is changed to a high level, the rising DLL clock signal 'RCKDLL' is changed to a high level by the first latch unit 230. Accordingly, at a point of time 'a', the rising DLL clock signal 'RCKDLL' is changed to a high level, and the first latch unit 230 continuously maintains the rising DLL clock signal 'RCKDLL' at a high level. Next, when the falling clock signal 'FCK' is at a high level (that is, the inverted signal of the falling clock signal 'FCK' is at a low level), and the delayed rising clock signal 'RCKDB' is at a low level, the first pull-up unit 210 is driven, and accordingly, the rising DLL clock signal 'RCKDLL' is reset at a low level by the first latch unit 230. Then, at a point of time 'b', the rising DLL clock signal 'RCKDLL' is changed to a low level.

When the falling clock signal 'FCK' and the delayed falling clock signal 'FCKDB' are both at a high level, the second pull-down unit 320 is driven, and accordingly the falling DLL clock signal 'FCKDLL' is changed to a high level. Therefore, at the point of time 'b', the falling DLL clock signal 'FCKDLL' is changed to a high level and the second latch unit 330 maintains a high level. Next, when the rising clock signal 'RCK' is at a high level (that is, the inverted signal 'RCKB' of the rising clock signal 'RCK' is at a low level), and the delayed falling clock signal 'FCKDB' is at a low level, the second pull-up unit 310 is driven, and accordingly the falling DLL clock signal 'FCKDLL' is reset at a low level by the second latch unit 330. Therefore, at a point of time 'c', the falling DLL clock signal 'FCKDLL' is changed to a low level.

As such, when the first delay unit 110 has a small delay time, the rising DLL clock signal 'RCKDLL' and the falling DLL clock signal 'FCKDLL' do not overlap each other.

Figure 8:
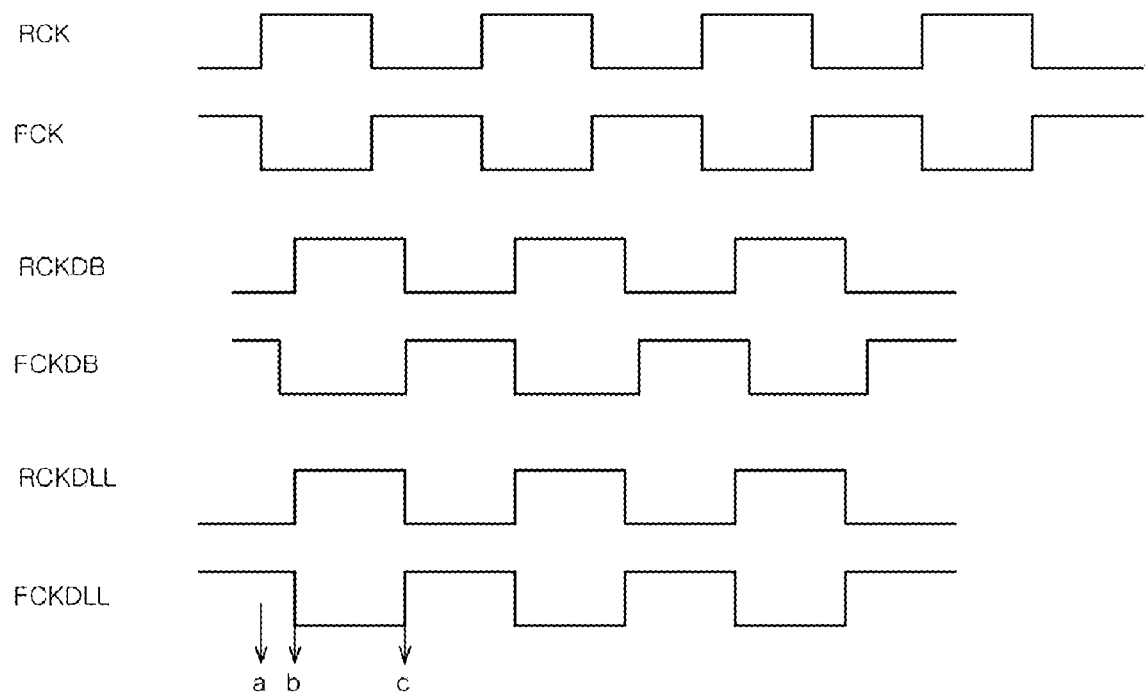

FIG. 8 is a timing chart showing a case where the rising clock signal 'RCK' and the falling clock signal 'FCK' of the DLL clock signal driver circuit shown in FIG. 6 do not overlap each other, and the first delay unit 110 and the second delay unit 120 have a relatively large delay time.

Unlike FIG. 7, FIG. 8 shows a case where the rising clock signal 'RCK' has a more advanced phase than the delayed rising clock signal 'RCKDB'. Accordingly, the first pull-down unit 220 is not driven until the delayed rising clock signal 'RCKDB' is changed to a high level. Therefore, from a point of time 'a' to a point of time 'b', the first pull-down unit 220 is not driven. Next, if the rising clock signal 'RCK' is changed to a high level at the point of time 'b', then the first pull-down unit 220 is driven. Then, the rising DLL clock signal 'RCKDLL' is changed to a high level and maintained at a high level until the first pull-up unit 210 is driven. Next, the first pull-up unit 210 is driven when the delayed rising clock signal 'RCKDB' is changed to a low level and the falling clock signal 'FCK' is changed to a high level. That is, at a point of time 'c', the rising DLL clock signal 'RCKDLL' is changed to a low level.

Until the delayed falling clock signal 'FCKDB' is changed to a high level, the second pull-down unit 320 is not driven. Next, if the delayed falling clock signal 'FCKDB' is changed to a high level, then the second pull-down unit 320 is driven. At this time, the second latch unit 330 is set to output the falling DLL clock signal 'FCKDLL' at a high level. Next, when the rising clock signal 'RCK' is at a high level, and the delayed falling clock signal 'FCKDB' is at a low level, the second pull-up unit 310 is driven, and the second latch unit 330 is reset to output the falling DLL clock signal 'FCKDLL' at a low level.

Similarly to FIG. 7, in FIG. 8, the rising DLL clock signal 'RCKDLL' and the falling DLL clock signal 'FCKDLL' do not overlap each other.

Figure 9:
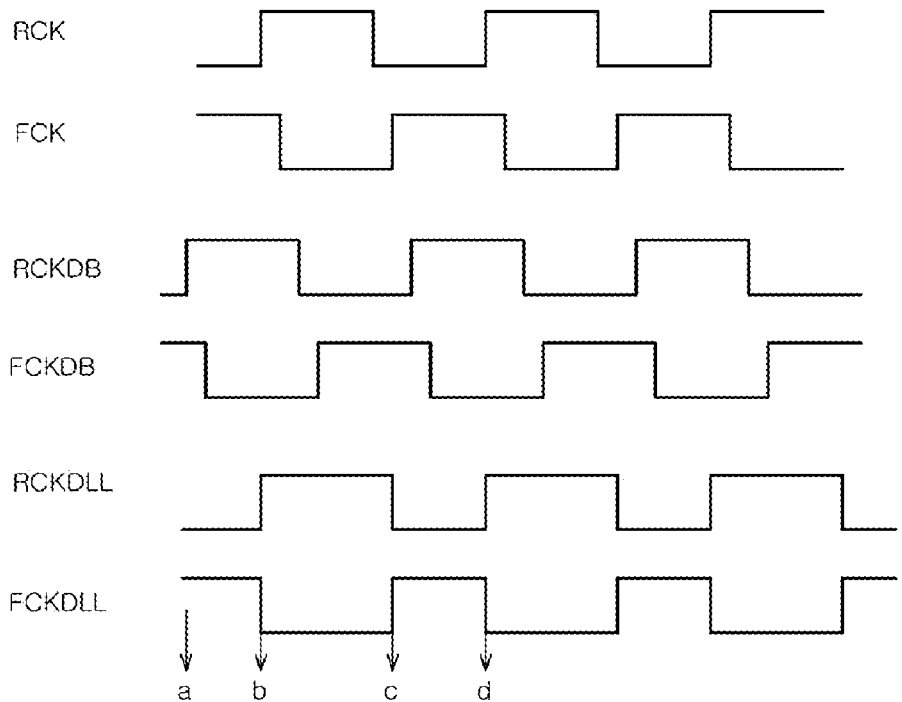

FIG. 9 shows a case where the rising clock signal 'RCK' and the falling clock signal 'FCK' are input to the DLL clock signal driver circuit in an overlap manner, and the rising clock signal 'RCK' has a more delayed phase from the delayed rising clock signal 'RCKDB'.

As can be seem, from a point of time 'a' to a point of time 'b', the delayed rising clock signal 'RCKDB' is at a high level, but the rising clock signal 'RCK' is at a low level. Accordingly, the rising DLL clock signal 'RCKDLL' is at a low level. Next, at the point of time 'b', if the rising clock signal 'RCK' is changed to a high level, then the rising DLL clock signal 'RCKDLL' is changed to a high level, and the first latch unit 230 maintains the rising DLL clock signal 'RCKDLL' at a high level.

Next, at a point of time 'c', if the falling clock signal 'FCK' is changed to a high level, and the delayed rising clock signal 'RCKDB' is at a low level, then the rising DLL clock signal 'RCKDLL' is changed to a low level. Next, at a point of time 'd', since the rising clock signal 'RCK' and the delayed rising clock signal 'RCKDB' are both at a high level, the rising DLL clock signal 'RCKDLL' is changed from a low level to a high level again.

At the point of time 'a', since the falling clock signal 'FCK' and the delayed falling clock signal 'FCKDB' are both at a high level, the falling DLL clock signal 'FCKDLL' is at a high level. Next, at the point of time 'b', since the rising clock signal 'RCK' is at a high level, and the delayed falling clock signal 'FCKDB' is at a low level, the falling DLL clock signal 'FCKDLL' is changed to a low level. Next, at the point of time 'c', since the rising clock signal 'RCK' and the delayed falling clock signal 'FCKDB' are both at a high level, the falling DLL clock signal 'FCKDLL' is changed to a high level. Next, at a point of time 'd', since the rising clock signal 'RCK' is at a high level, and the delayed falling clock signal 'FCKDB' is at a low level, the falling DLL clock signal 'FCKDLL' is changed to a low level.

As shown in FIG. 9, when the falling clock signal 'FCK' and the rising clock signal 'RCK' are input in an overlap manner, the rising DLL clock signal 'RCKDLL' and the falling DLL clock signal 'FCKDLL' are output so as not to overlap each other.

Figure 10:
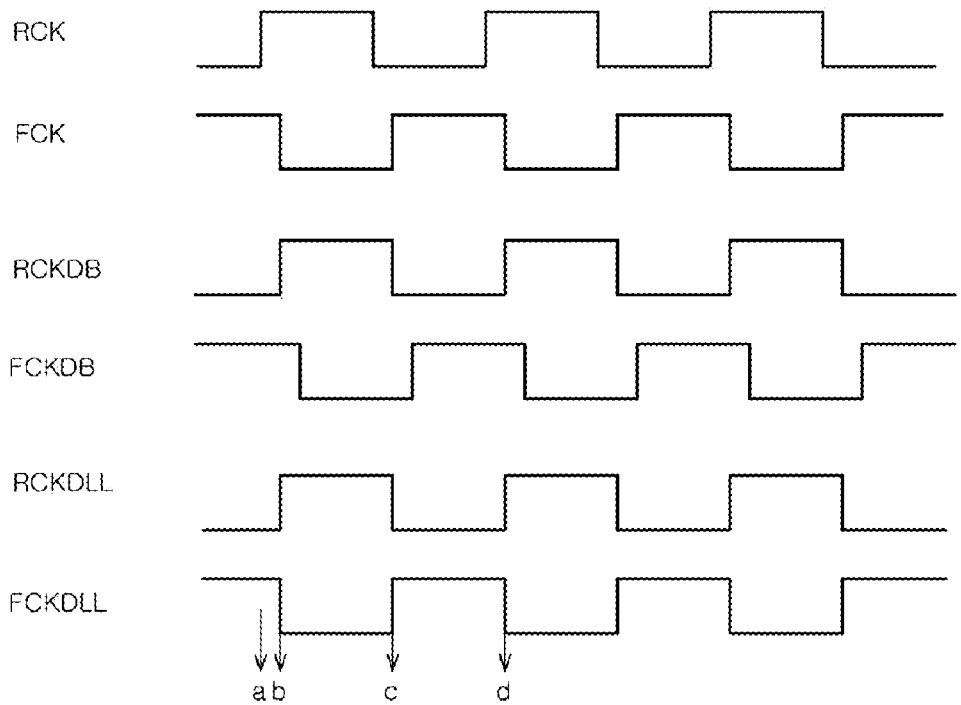

FIG. 10 is a timing chart showing a case where the rising clock signal 'RCK' and the falling clock signal 'FCK' overlap each other, and the rising clock signal 'RCK' has a more advanced phase than the delayed rising clock signal 'RCKDB'.

As can be seen, at a point of time 'b', when the delayed rising clock signal 'RCKDB' is changed to a high level, the rising DLL clock signal 'RCKDLL' is set and changed to a high level. Next, at a point of time 'c', since the falling clock signal 'FCK' is at a high level, and the delayed rising clock signal 'RCKDB' is at a low level, the rising DLL clock signal 'RCKDLL' is changed to a low level. Next, at a point of time 'd', when the delayed rising clock signal 'RCKDB' is changed to a high level, the rising DLL clock signal 'RCKDLL' is set and changed to a high level.

At the point of time 'a', since the falling clock signal 'FCK' and the delayed falling clock signal 'FCKDB' are both at a high level, the falling DLL clock signal 'FCKDLL' is changed to a high level. Next, at the point of time 'b', since the rising clock signal 'RCK' is at a high level, and the delayed falling clock signal 'FCKDB' is at a low level, the falling DLL clock signal 'FCKDLL' is changed to a low level. At the point of time 'c', since the falling clock signal 'FCK' and the delayed falling clock signal 'FCKDB' are both at a high level, the falling DLL clock signal 'FCKDLL' is changed to a high level.

As shown in FIG. 10, even if the falling clock signal 'FCK' and the rising clock signal 'RCK' overlap each other, and the rising clock signal 'RCK' has a more advanced phase than the delayed rising clock signal 'RCKDB', then the rising DLL clock signal 'RCKDLL' and the falling DLL clock signal 'FCKDLL' do not overlap each other.

Thus, the rising DLL clock signal 'RCKDLL' and the falling DLL clock signal 'FCKDLL' are generated without generating the pulses having a predetermined width. Therefore, there is no case where the pulse is lost or the output is distorted due to the deterioration in performance of the transistor at high frequency. In addition, the rising DLL clock signal 'RCKDLL' and the falling DLL clock signal 'FCKDLL' are generated so as not to overlap each other.

In other embodiments, the first pull-up unit 210 can input the signals to the first switching element 211 and the second switching element 212 in a reverse manner. Similarly, the first pull-down unit 220, the second pull-up unit 310, and/or the second pull-down unit 320 can also input the signals to the first switching elements 221, 311, and 321 and the second switching elements 222, 312, and 322, respectively, in a reverse manner.

It will be understood that although the embodiments have been described by way of the DLL clock signal driver, it can also be applied to a general internal clock signal driver circuit.

According to the embodiments described herein, the rising DLL clock signal 'RCKDLL' and the falling DLL clock signal 'FCKDLL' are output so as not to overlap each other, without being limited by the delay time of the first delay unit 110 and the second delay unit 120 or the frequencies of the rising clock signal 'RCK' and the falling clock signal 'FCK', and how the rising clock signal 'RCK' and the falling clock signal 'FCK' overlap each other. Therefore, in a semiconductor integrated circuit that uses a high-frequency clock signal, a DLL clock signal driver configured in accordance with the embodiments described herein can be more usefully applied.

An internal clock signal driver circuit according to the embodiments described herein can implement a circuit in which the rising DLL clock signal and the falling DLL clock signal do not overlap each other, regardless of the frequency, thereby preventing the data from being distorted due to the DLL clock signal signals.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An internal clock signal driver circuit, comprising:
a delay block configured to delay a rising clock signal and a falling clock signal, and output a delayed rising clock signal and a delayed falling clock signal;
a rising DLL clock signal generating block coupled with the delay block, the rising DLL clock signal generating block configured to receive and combine the rising clock signal, the falling clock signal, and the delayed rising clock signal, and output a rising DLL clock signal; and
a falling DLL clock signal generating block coupled with the delay block, the falling DLL clock signal generating block configured to receive and combine the rising clock signal, the falling clock signal, and the delayed falling clock signal, and outputs a falling DLL clock signal.

2. The internal clock signal driver circuit of claim 1, wherein the rising DLL clock signal generating block comprises a pull-up unit and a pull down unit, which are switched according to the delayed rising clock signal, and wherein the rising DLL clock signal generating block is further configured to output the rising DLL clock signal through the pull-up unit and the pull-down unit.

3. The internal clock signal driver circuit of claim 1, wherein the falling DLL clock signal generating block comprises a pull-up unit and a pull-down unit, which are switched according to the delayed falling clock signal, and wherein the falling DLL clock signal generating block is further configured to output the falling DLL clock signal through the pull-up unit and the pull-down unit.

4. The internal clock signal driver circuit of claim 2, wherein the rising DLL clock signal generating block is further configured to output the rising DLL clock signal that is enabled when the rising clock signal and the delayed rising clock signal are both enabled, and is disabled when an inverted signal of the falling clock signal and the delayed rising clock signal are both disabled.

5. The internal clock signal driver circuit of claim 3, wherein the falling DLL clock signal generating block is further configured to output the falling DLL clock signal that is enabled when the falling clock signal and the delayed falling clock signal are both enabled, and is disabled when the rising clock signal and an inverted signal of the delayed falling clock signal are both enabled.

6. The internal clock signal driver circuit of claim 1, wherein the rising DLL clock signal generating block includes:
a first pull-down unit configured to pull down a voltage on a first node according to the rising clock signal and the delayed rising clock signal;
a first pull-up unit configured to pull up the voltage on the first node according to the inverted signal of the falling clock signal and the delayed rising clock signal; and
a first latch unit configured to latch the voltage on the first node and outputs the rising DLL clock signal.

7. The internal clock signal driver circuit of claim 6, wherein the first pull-down unit is further configured to pull down the voltage on the first node when the delayed rising clock signal and the rising clock signal are both enabled.

8. The internal clock signal driver circuit of claim 7, wherein the first pull-down unit includes:
a first switching element that is connected between the first node and a second node and is configured to pull down the voltage on the first node to a voltage on the second node according to the rising clock signal; and
a second switching element that is connected between the second node and a ground voltage terminal and is configured to pull down the voltage on the second node to the ground voltage according to the delayed rising clock signal.

9. The internal clock signal driver circuit of claim 7, wherein the first pull-down unit includes:
a first switching element that is connected between the first node and a second node and is configured to pull down the voltage on the first node to a voltage on the second node according to the delayed rising clock signal; and
a second switching element that is connected between the second node and a ground voltage terminal and is configured to pull down the voltage on the second node to the ground voltage according to the rising clock signal.

10. The internal clock signal driver circuit of claim 6, wherein the first pull-up unit is configured to pull up the voltage on the first node when the delayed rising clock signal and the inverted signal of the falling clock signal are both disabled.

11. The internal clock signal driver circuit of claim 10, wherein the first pull-up unit includes:
a first switching element that is connected between the first node and a second node and is configured to pull up the voltage on the first node to a voltage on the second node according to the delayed rising clock signal; and
a second switching element that is connected between the second node and a power supply voltage and is configured to pull up the voltage on the second node to the power supply voltage according to the inverted signal of the falling clock signal.

12. The internal clock signal driver circuit of claim 10, wherein the first pull-up unit includes:
a first switching element that is connected between the first node and a second node and is configured to pull up the voltage on the first node to a voltage on the second node the inverted signal of the falling clock signal; and
a second switching element that is connected between the second node and a power supply voltage and is configured to pull up the voltage on the second node to the power supply voltage according to the delayed rising clock signal.

13. The internal clock signal driver circuit of claim 6, wherein the first latch unit includes:
a first inverter configured to invert the voltage on the first node and output the rising DLL clock signal; and
a second inverter configured to receive the output of the first inverter and has an output terminal connected to the first node.

14. The internal clock signal driver circuit of claim 1, wherein the falling DLL clock signal generating block includes:
a first pull-down unit configured to pull down the voltage on the first node according to the falling clock signal and the delayed falling clock signal;
a first pull-up unit configured to pull up the voltage on the first node according to an inverted signal of the rising clock signal and the delayed falling clock signal; and
a first latch unit configured to latch the voltage on the first node and output the falling DLL clock signal.

15. The internal clock signal driver circuit of claim 14, wherein the first pull-down unit is further configured to pull down the voltage on the first node when the delayed falling clock signal and the falling clock signal are both enabled.

16. The internal clock signal driver circuit of claim 15, wherein the first pull-down unit includes:
a first switching element that is connected between the first node and a second node and is configured to pull down the voltage on the first node to a voltage on the second node according to the falling clock signal; and a second switching element that is connected between the second node and a ground voltage and is configured to pull down the voltage on the second node to the ground voltage according to the delayed falling clock signal.

17. The internal clock signal driver circuit of claim 15, wherein the first pull-down unit includes:

a first switching element that is connected between the first node and a second node and is configured to pull down the voltage on the first node to a voltage on the second node according to the delayed falling clock signal; and a second switching element that is connected between the second node and a ground voltage and is configured to pull down the voltage on the second node to the ground voltage according to the falling clock signal.

18. The internal clock signal driver circuit of claim 14, wherein the first pull-up unit is further configured to pull up the voltage on the first node when the delayed falling clock signal and the inverted signal of the rising clock signal are both disabled.

19. The internal clock signal driver circuit of claim 18, wherein the first pull-up unit includes:

a first switching element that is connected between the first node and a second node and is configured to pull up the voltage on the first node to a voltage on the second node according to the delayed falling clock signal; and a second switching element that is connected between the second node and a power supply voltage and is configured to pull up the voltage on the second node to the power supply voltage according to the inverted signal of the rising clock signal.

20. The internal clock signal driver circuit of claim 18, wherein the first pull-up unit includes:

a first switching element that is connected between the first node and a second node and is configured to pull up the voltage on the first node to a voltage on the second node according to the inverted signal of the rising clock signal; and a second switching element that is connected between the second node and a power supply voltage and is configured to pull up the voltage on the second node to the power supply voltage according to the delayed falling clock signal.

21. The internal clock signal driver circuit of claim 14, wherein the first latch unit includes:

a first inverter configured to invert the voltage on the first node and outputs the falling DLL clock signal; and a second inverter configured to receive the output of the first inverter and has an output terminal connected to the first node.

22. The internal clock signal driver circuit of claim 1, wherein the delay block includes:

a first delay unit configured to delay the rising clock signal for a first time and output the delayed rising clock signal; and a second delay unit configured to delay the falling clock signal for a second time and output the delayed falling clock signal.

23. The internal clock signal driver circuit of claim 22, wherein the first delay unit includes a first delay element configured to delay the rising clock signal for the first time, and a first inverter configured to invert the output of the first delay unit, and wherein the second delay unit includes a second delay element configured to delay the falling clock signal for the second time and a second inverter configured to invert the output of the second delay unit.

* * * * *